United States Patent [19]

Haitz

[11] Patent Number: 5,707,139

[45] Date of Patent: Jan. 13, 1998

[54] VERTICAL CAVITY SURFACE EMITTING LASER ARRAYS FOR ILLUMINATION

[75] Inventor: Roland H. Haitz, Portola Valley, Calif.

[73] Assignee: Hewlett-Packard Company, Palo Alto, Calif.

[21] Appl. No.: 548,346

[22] Filed: Nov. 1, 1995

[51] Int. Cl.[6] .................................................. F21V 9/00

[52] U.S. Cl. .................... 362/231; 362/259; 362/800; 372/43

[58] Field of Search ........................... 362/230, 231, 362/240, 242, 244, 259, 800, 268; 372/43, 50; 257/88, 90, 96

[56] References Cited

U.S. PATENT DOCUMENTS

| 5,325,386 | 6/1994 | Jewell et al. | 372/50 |
| 5,535,230 | 7/1996 | Abe | 372/43 |

*Primary Examiner*—Stephen F. Husar
*Attorney, Agent, or Firm*—Jonathan B. Penn

[57] ABSTRACT

Arrays of vertical cavity surface emitting lasers ("VCSEL"s) used for illumination in both infra-red and visible light wavelengths are described. By using several different arrays, each array generating light of a different wavelength, a replacement for conventional lighting sources can be obtained. The present invention offers lower power consumption and longer operating lifetime than known lighting technologies.

7 Claims, 2 Drawing Sheets

VERTICAL CAVITY SURFACE EMITTING LASER ARRAYS FOR ILLUMINATION

BACKGROUND OF THE INVENTION

This invention is in the field of semiconductor light emitting devices. More specifically, the invention relates to light emitting diodes ("LED"s) and vertical cavity surface emitting lasers ("VCSEL"s).

One of the largest uses of electricity in the world today is for residential, commercial, and public illumination. By some estimates, roughly 30–40% of all electricity is used for lighting. Any significant improvements in lighting efficiency will have potentially enormous economic benefits.

Unfortunately, although lighting efficiency improved dramatically in the first half of the twentieth century, the last 25 years have seen only relatively small improvements in previously known lighting technologies such as incandescent and fluorescent lamps. Only LEDs have improved markedly in the last twenty years, but, at approximately 1 lm per LED, they are simply not an economical alternative for area lighting purposes.

A new lighting technology that offers improved conversion efficiency at reasonable cost would be highly desirable.

SUMMARY OF THE INVENTION

In its first embodiment, the present invention comprises a two dimensional array of 30 to 100 GaAlAs or GaInAs VCSELs, generating light at wavelengths of 850 nm and 980 nm, respectively. The individual VCSELs are driven in parallel from a single current source. To avoid possible eye damage, each laser is generating a relatively low amount of power; in this case, 3 mW. This array can be used for infra-red ("IR") wireless communication, such as the IrDA standard, but at higher speeds than can be obtained using LEDs. IR local area networks ("LAN"s) or interactive TV can also utilize this embodiment of the present invention.

In a second embodiment, a plurality of VCSEL arrays, assembled together within a single housing and with each array operating at a different visible light wavelength, are driven in parallel at low power per individual VCSEL element. As the different wavelengths of the individual VCSEL arrays cover the edges of the chromaticity diagram, a white area lighting source of extremely high efficiency is created.

These embodiments will now be described in detail, with reference to the figures listed and described below.

BRIEF DESCRIPTION OF THE ILLUSTRATIONS

DETAILED DESCRIPTION OF THE PREFERRED EMBODIMENT

VCSELs and methods for manufacturing them are known. See, for example, U.S. Pat. Nos. 5,359,618 and 5,164,949. Forming VCSELs into two-dimensional arrays for data displays is also known. See U.S. Pat. Nos. 5,325,386 and 5,073,041.

Recently, Sandia National Laboratories demonstrated a VCSEL with a conversion efficiency from electrical power to optical flux of 50% (5 mW of optical power from a 5 mA current and 2 V voltage). The Sandia VCSEL used a GaInAs material system, generated light at a wavelength of 980 nm and was roughly 8–10 microns in diameter.

VCSEL arrays (1×8) of GaAlAs operating at 850 nm have been fabricated. The inventor herein has experimented with these arrays by operating the VCSELs in parallel from a single source. Although these arrays operate at only 15–25% conversion efficiency, as compared to Sandia's 50%, they verify the feasibility of operating large arrays of VCSELs in parallel without thermal runaway. Thermal runaway occurred in early power transistors when one emitter finger in the array of emitter fingers used in a single power transistor began to "hog" the current, which increased its operating temperature, which in turn led to even higher current usage, in an accelerating cycle that led to the destruction of the transistor. The inventor herein believes that the series resistance of the Bragg reflectors in each of the VCSELs, undesirable as it is, stabilizes the device and prevents current hogging.

Figure 1:
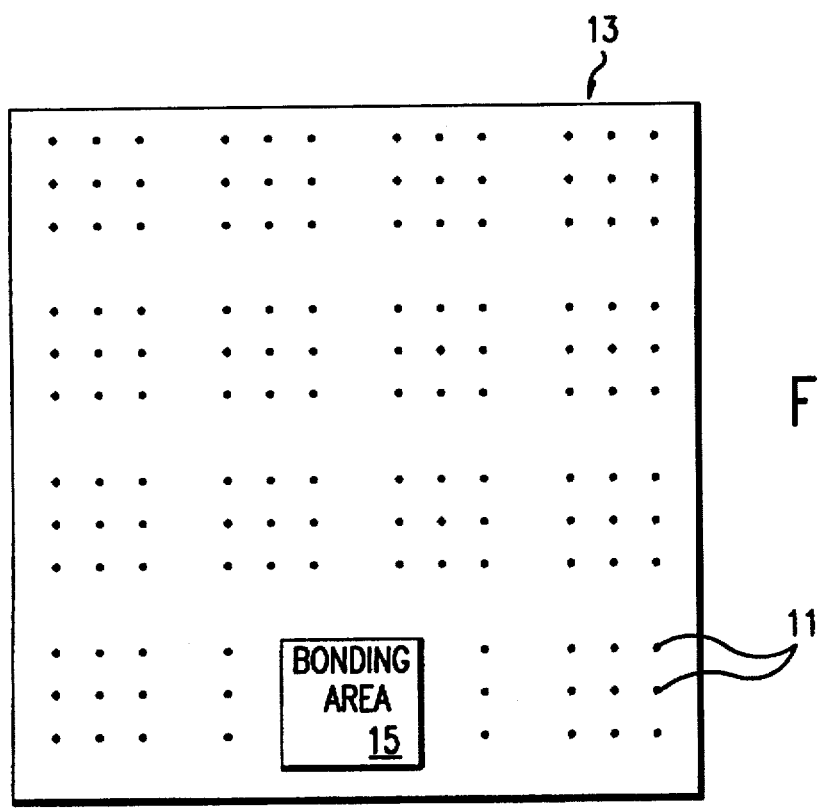
FIG. 1 shows the first embodiment of the present invention, for use in IR communication.

By operating these VCSELs in parallel, an optical power source is obtained. In a first embodiment, shown in FIG. 1, an array of approximately 10 µm VCSELs 11, spaced 40 µm apart center-to-center is fabricated on a 20×20 mil chip 13. A 12×12 laser array is easily accommodated. A total of 128 lasers allows for a 5×5 mil bonding area 15. If each laser is operated at 2 mA and 2 V, delivering 2 mW of optical flux, then the total input power to the array is 0.5 W and the optical output power is approximately 0.25 W. The remaining 0.25 W must be removed as heat.

Removing the heat is a straightforward task. If the lasers are fabricated on a GaAs substrate, the thermal resistance comprises a spreading term from the 10 µm circle to the substrate and a linear term of thermal resistance between the lasers and the back surface of the chip. With a heat flow of 0.25 W, the spreading resistance raises the temperature by 1.4° C. and the substrate adds another 2.9° C. for a total chip related temperature rise of 4.3° C. Mounting the chip on a heat spreading substrate, such as chemical vapor deposition ("CVD") grown diamond, AlN or plain copper controls the heat flux without a significant temperature rise.

The VCSELs can also be mounted face down on a heat spreading substrate, which would further reduce the temperature rise within the chip. In this case, the light would be extracted through the substrate. At 980 nm, the GaAs substrate is transparent. At shorter wavelengths, the substrate would have to be replaced by wafer bonding the structure to a GaP substrate.

LEDs fabricated from GaAlAs and radiating at 850 nm have a demonstrated internal quantum efficiency of 100%. Proper optimization of the VCSEL design in an array similar to that shown in FIG. 1 should result in power conversion efficiencies greater than 50%. Such optical power sources would enable IR communication at higher speeds than known IR LEDs permit. They may permit IR LANs and interactive TV. Another possible application is using the arrays for security illumination.

The most significant application for VCSEL arrays is for illumination, using a series of arrays that individually generate light in different parts of the visible light spectrum. Sandia National Laboratory has demonstrated red VCSELs fabricated from a GaAlInP material system. These VCSELs generated light at wavelengths from 635–680 nm and at power levels as high as 8 mW for a single VCSEL. The conversion efficiency for the best devices was approximately 15%. In the green and blue portions of the visible light spectrum, GaInN devices have demonstrated lasing by optical pumping and green/blue Fabry-Perot lasers have been demonstrated with a ZnSe material system. In the relatively near future, GaInN will be used in Fabry-Perot lasers and in VCSELs.

It is assumed that the same conversion efficiency that has been demonstrated for VCSELs operating at 980 nm will be available at any visible light wavelength from red to blue. The IR VCSEL chip described above can then be scaled to 1×1 mm with the same area density of lasers to provide a monochromatic visible light illumination VCSEL array chip. This chip, with approximately 500 lasers operating at 2 mA per laser, would have an optical flux of 1 W at 50% conversion efficiency. At 560 nm, such a chip would generate a luminous flux of 680 lm. At an input current of 1 A and an applied voltage of 2 V, the chip would have a luminous efficiency of 340 lm/W.

A white light source can be constructed from six VCSEL chips, each chip having an optical flux of 1 W and generating light at equally spaced wavelengths between 475 nm (blue light) and 625 nm (red light).

TABLE 1

| Wavelength (nm) | Flux (lm) |
| --- | --- |
| 475 | 77 |
| 505 | 343 |
| 535 | 622 |
| 565 | 665 |
| 595 | 473 |
| 625 | 218 |
| White | 2398 |

Table 1 shows the wavelength/flux relationship for a VCSEL illumination source having six VCSEL arrays and an input of 12 W. This light source with an input of 12 W will generate an optical flux of approximately 2400 lm. Its efficiency is roughly 200 lm/W. A comparison with conventional white light sources of comparable flux levels is shown in Table 2. The 2400 lm flux is equivalent to the flux of a 170 W incandescent light bulb.

Figure 2:
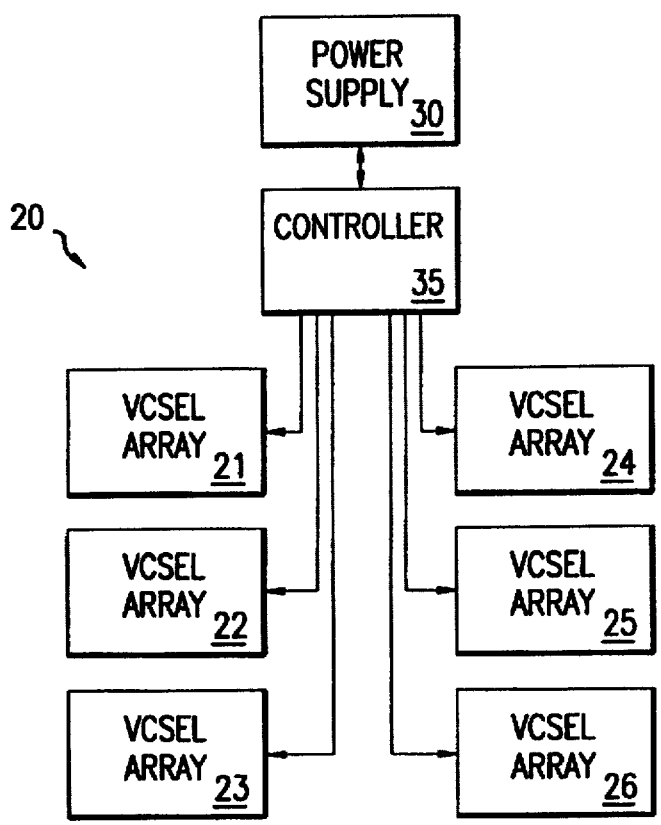
FIG. 2 shows a second embodiment of the present invention, for use as an area illumination device.

FIG. 2 is a schematic drawing of such a white light illumination source 20 comprised of VCSEL arrays 21 through 26, inclusive. The VCSEL arrays each generate a different wavelength of visible light. In a first preferred embodiment, these arrays will generate light at the wavelengths listed in Table 1. The VCSEL arrays are in turn coupled to power supply 30 through controller 35. At a minimum, power supply 30 must be capable of driving each of the lasers in all of the VCSEL arrays in parallel at the minimum current required for lasing. Controller 35 will permit additional operational flexibility by permitting the user to command more or less light output from the individual arrays and from all of the arrays simultaneously. In so doing, the user can control the color temperature of the source 20, as well as its final light output.

The described VCSEL array white light illumination source will have many advantages over known lighting sources. Table 2 summarizes the efficiency advantages of VCSEL illumination sources over known lighting technologies.

TABLE 2

| Type | Efficiency (lm/W) | VCSEL Advantage |
| --- | --- | --- |
| Incandescent | 14 | 15x |
| Halogen | 20 | 10x |
| Fluorescent | 80 | 2.5x |
| Metal Halide | 80 | 2.5x |
| Mercury | 40 | 5x |

A VCSEL based light source would offer several other additional advantages over known illumination sources.

Recent tests with the 980 nm VCSEL array fabricated by Sandia indicate that these arrays can be operated over a power range of from 0.5 to 5.0 mW at practically constant efficiency. Controller 35 can be used to effect this dimming by reducing the drive current to each of the VCSEL arrays equally and in parallel. The dimming range can be further extended if the VCSEL elements of each array have a single common cathode but multiple, independent anodes. This would allow parts of the VCSEL array to be turned on and off independently. Assuming that 10 separate anodes were fabricated for a single array, the dimming range of the array could be extended by an additional factor of 10, in combination with reducing the drive current. The cost of this extended dimming range is small, involving only small changes to the VCSEL fabrication process and controller design. Conventional light sources either cannot be dimmed, or, if they can be dimmed, they experience substantial losses in efficiency, and, in the case of halogen lamps, reduced operating life.

By varying the drive current to the individual color VCSEL arrays in the white light source of FIG. 2 by using controller 35, the color temperature of the light can be changed from bluish cold white to a more yellow, warmer white or any variation or combination in between. Source 20 can thus operate over the entire chromaticity diagram. A single white light source can also be used as a monochromatic light source of at least six different colors with only a small additional expense. Combined with the dimming ability previously described, the ability to vary color and/or temperature makes the present invention a universal source for decorative or theatrical lighting.

Fluorescent lamps generate white light by stimulating a phosphor layer with UV light. The phosphor layer is a mixture of phosphors generating predominantly three nearly monochromatic lines of light (red, green and blue). The VCSEL light source would use six lines of light which improves the color rendering of the illumination source. Eventually it will be possible to build an illumination source with 12 half watt chips with 15 nm light steps instead of the previously described 6 one watt chips with 30 nm steps. Such a device will surpass the color rendering properties of practically any existing light source.

The described white light source has the inherent modulation speed of VCSELs, which can be turned off and on at gigahertz frequencies. This allows the illumination source to be used to distribute signals at gigabits per second rates. A low cost, highly asymmetric local area network where high speed signals such as video are broadcast via the light source and low speed signals use conventional telephone wiring can be readily constructed using the present invention. A unidirectional signal distribution system in a grocery store, wherein the VCSEL white light illumination source is used both for illumination and signal transmission would permit battery powered electronic shelf labels to be updated through the lighting system without the installation of an IR or RF broadcast system. In general, optical receivers are simpler than RF receivers. When using the present invention, the illumination power levels are very high, permitting the construction of a visible light receiver that would be even simpler than an IR receiver.

Light sources constructed according to the present invention experience no "turn on" delays, unlike the turn on delay commonly associated with fluorescent light sources. They also have a lifetime measured in tens of thousands of hours, and perhaps as long as ten years.

The light output from an individual VCSEL is a collimated beam with a dispersion of approximately 10°. This beam can be intercepted with low cost optical surfaces to redistribute the flux efficiently to wherever illumination is desired. In case where light spilling is unnecessary or undesirable, this feature translates into another 2x to 5x efficiency improvement when compared with isotropic high temperature conventional light sources.

As the VCSEL array operates at roughly room temperature, optical surfaces can be located safely in very close proximity. This permits the design and construction of very compact, flat lighting fixtures that are consistent with flush ceiling mounts in commercial or residential buildings.

Using VCSELs for illumination does raise the issue of eye safety. Light with a temporal coherent wavefront can readily be focused by the eye into a diffraction limited spot on the retina. If the power level in this spot exceeds approximately 200 µW, permanent damage to the retina can result.

The VCSEL array has a unique feature that answers the eye safety issue. If the diameter of the individual elements in the VCSEL is increased to 20 to 25 µm, then the VCSEL no longer lases as one element with temporal coherence. The emitting area breaks into multiple filaments that are not locked into a single coherent mode. If adjacent VCSELs are separated by roughly 20–50 µm, the array behaves like a number of independent lasers. Temporal coherence is limited to the flux of individual elements, which, in the first preferred embodiment operate at roughly 2 mW each. The temporal coherence of an individual laser element can also be destroyed by intersecting the beam with a holograph-like phase shifting surface. Instead of having to destroy the phase coherence of a 1 W laser, the coherence of many independent 2 mW lasers needs to be destroyed. Thus, the phase coherence must be reduced by a single order of magnitude, as opposed to nearly four orders of magnitude.

Figure 3:
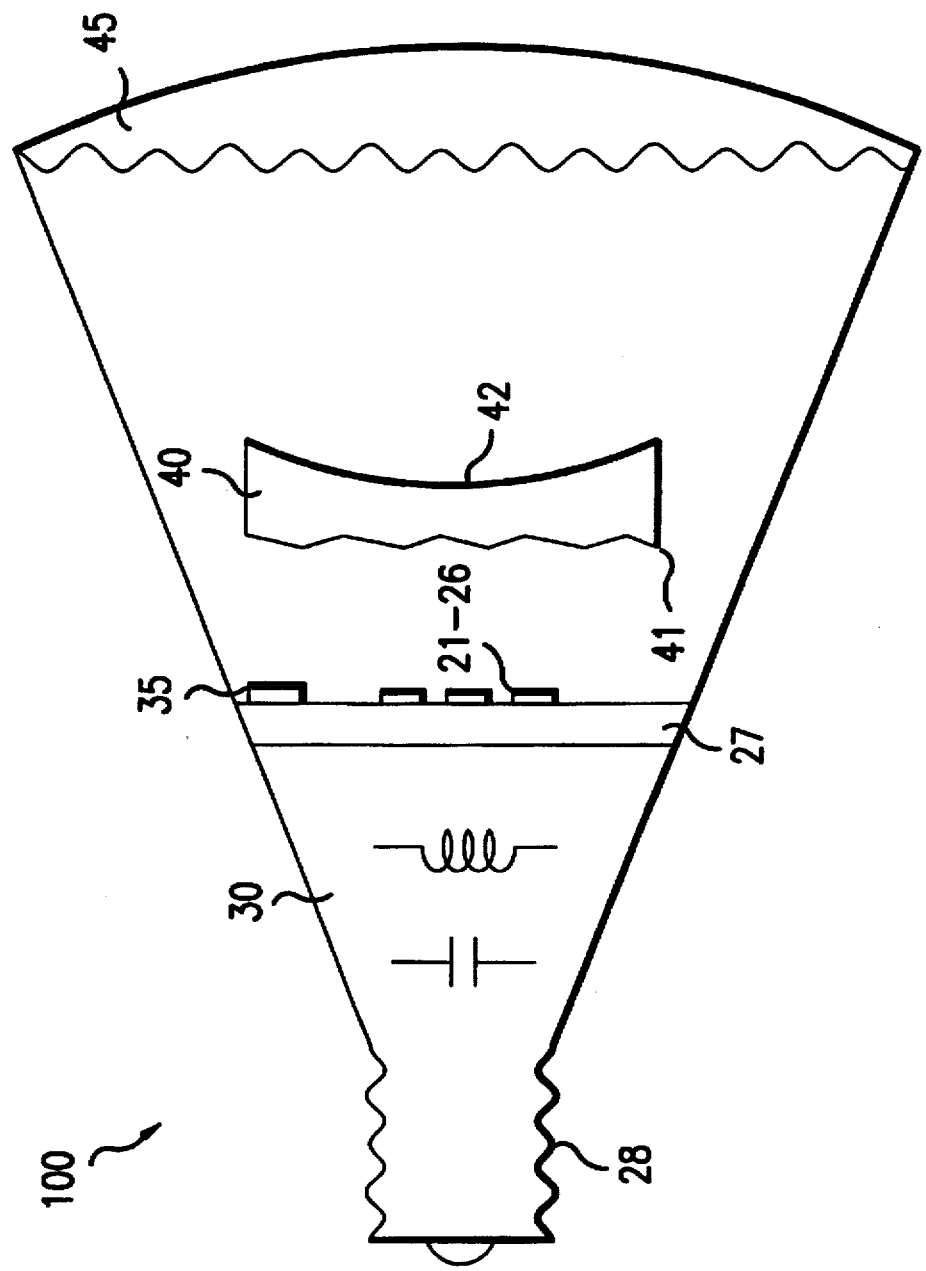
FIG. 3 shows how the second embodiment of the present invention can be incorporated into a package compatible with known lighting systems.

As shown in FIG. 3, light source 20 of FIG. 2 can be packaged to fit into a known light source package; here, a standard incandescent screw-in light bulb, creating a lighting source 100 that can be easily retro fitted. Using the same numbering from FIG. 2 where appropriate, VCSEL arrays 21 through 26 are mounted on ceramic substrate 27 and controlled by controller 35. Discrete power supply components 30 are located behind substrate 27 and receive power through socket 28 from a power source. Primary beam shaping optics 40 has rear optical surface 41 which destroys the phase coherence of VCSELs 21 through 26 to prevent eye damage and front surface 42 which shapes the light after its phase coherence has been destroyed. Secondary beam shaping optics 45 are used to collimate and focus the beam to suit the particular lighting application. By changing secondary beam shaping optics 45, one lighting source can serve in many different applications.

Global electricity consumption has an economic value of approximately 1.2 trillion dollars. Approximately 33–40% is used for lighting. Reducing the energy cost of lighting by a factor 5 to 10 has an economic impact of $300–400 billion a year.

Converting 90% of lighting installations to VCSEL based light sources over a 30 year period will so reduce demand for electrical generation that other non-lighting uses of electricity will be able to grow at a rate of 1.0% per year for 30 years without requiring any increase in the global installed electrical generation base. In areas of warm climate, these savings might be even higher, as VCSEL arrays will generate less heat to be removed by air conditioning systems.

What is claimed is:

1. An infra-red illumination source comprising:
   a plurality of vertical cavity surface emitting laser chips, each chip comprised of a plurality of vertical cavity surface emitting laser elements, the elements on each chip emitting infra-red light and being coupled together so that they can be driven at least in parallel, the chips being coupled together by a combination of series and parallel couplings; and
   a power supply coupled to the chips for providing drive current to the elements.

2. The source of claim 1 wherein the elements on each chip generate infra-red light of a different wavelength than that generated by the elements on the other chips.

3. The source of claim 2 wherein the elements on each chip generate infra-red light with a wavelength between 700 and 1000 nm.

4. The source of claim 1 wherein the elements can be modulated at a frequency of at least 10 MHz.

5. The source of claim 2 wherein a phase destroying optical system is placed between the chips and objects being illuminated, the phase destroying optical system reducing the temporal coherence of the elements.

6. The source of claim 5 wherein the source is used to provide infra-red illumination for security purposes.

7. The source of claim 1 wherein each element has a cathode and an anode contact, the cathode contact of all elements on a chip being common and the anode contacts being formed into at least two separate anode groups, dimming of the source then being accomplished by a combination of decreasing the drive current to the elements and turning off those elements coupled to at least one of the anode groups.

* * * * *